(12) United States Patent
Ashokkumar et al.

(10) Patent No.: US 7,539,054 B2
(45) Date of Patent: May 26, 2009

(54) METHOD AND APPARATUS TO PROGRAM AND ERASE A NON-VOLATILE STATIC RANDOM ACCESS MEMORY FROM THE BIT LINES

(75) Inventors: Jayant Ashokkumar, Colorado Springs, CO (US); David W. Still, Colorado Springs, CO (US); James D. Allan, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 328 days.

(21) Appl. No.: 11/644,641

(22) Filed: Dec. 22, 2006

(65) Prior Publication Data

US 2008/0155186 A1    Jun. 26, 2008

(51) Int. Cl.
    *G11C 16/04*    (2006.01)
(52) U.S. Cl. .............................. 365/185.07; 365/185.19

(58) Field of Classification Search ............ 365/185.07, 365/185.19, 185.28
    See application file for complete search history.

(56) References Cited

U.S. PATENT DOCUMENTS

| | | | | |
|---|---|---|---|---|
| 5,892,712 A | * | 4/1999 | Hirose et al. ............ | 365/185.07 |
| 2005/0141267 A1 | * | 6/2005 | Kwon ........................ | 365/154 |
| 2005/0141272 A1 | * | 6/2005 | Jung ..................... | 365/185.08 |

OTHER PUBLICATIONS

SIMTEK, nvSRAM Basics, www.simtek.com/attachments/AppNote01.pdf, Sep. 10, 2008.

\* cited by examiner

*Primary Examiner*—Vu A Le

(57) ABSTRACT

A system and method for programming and erasing a semiconductor memory is disclosed. More particularly, the present invention uses the bit lines of a volatile memory portion of semiconductor memory so as to program and erase the non-volatile portion of the semiconductor memory.

2 Claims, 8 Drawing Sheets

METHOD AND APPARATUS TO PROGRAM AND ERASE A NON-VOLATILE STATIC RANDOM ACCESS MEMORY FROM THE BIT LINES

BACKGROUND OF THE INVENTION

1. Field of the Invention

The present invention is generally directed to memory, and more particularly to programming the non-volatile section of a non-volatile Static Random Access Memory (SRAM) from the bit lines of the volatile section.

2. The Relevant Technology

Semiconductor memory devices are widely used in the computer and electronics industries as a means for retaining digital information. A typical semiconductor memory device is comprised of a large number of memory elements, known as memory cells, that are each capable of storing a single digital bit. The memory cells are arranged into a plurality of separately addressable memory locations, each being capable of storing a predetermined number of digital data bits. All of the memory cells in the device are generally located upon a single semiconductor chip which is contacted and packaged for easy insertion into a computer system.

A particular semiconductor memory device has a non-volatile portion and a volatile portion. The non-volatile portion typically has a dual memory stack configuration, with each stack having a number of transistors, including at least one SONOS transistor. The volatile portion is typically an SRAM that is coupled to the non-volatile portion for the transmission of data there between. The non-volatile portion is typically programmed using the data from the volatile portion. Since silicon area is at such a premium in semiconductor memory and the desire is always to decrease the space and increase the speed, functionality and efficiency, alternate ways of programming and erasing are desirable.

It would be advantageous to provide a method and apparatus for programming the non-volatile section of the semiconductor memory from the bit lines associated with the volatile portion without utilizing additional silicon overhead associated with a voltage supply node to the non-volatile section.

BRIEF SUMMARY OF THE INVENTION

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In one embodiment, a method for programming and erasing a first and second tri-gate structure in a non-volatile SRAM cell from a bit line pair is disclosed. The non-volatile SRAM typically has a volatile portion and a non-volatile portion. Each tri-gate structure in the non-volatile portion comprises a recall transistor, a store transistor and a SONOS transistor. The volatile portion has an SRAM cell with a word line, a node supplying power to said SRAM cell and a bit line pair with a first bit line and a second bit line. The drain of a first recall transistor in the first tri-gate structure is coupled to said first bit line of said bit line pair and the drain of a second recall transistor in the second tri-gate is coupled to the second bit line of the bit line pair.

Continuing, a first SONOS transistor in the first tri-gate structure and a second SONOS transistor in the second tri-gate structure are erased. The volatile portion is isolated from said non-volatile portion by turning off a first store transistor in the first tri-gate structure and turning off a second store transistor in the second tri-gate structure. A programming pulse and a programming voltage is then applied to the first and second SONOS transistors in the first and second tri-gate structures, which programs one of the tri-gate structures. The first bit line is maintained at a voltage corresponding to a high condition for said first bit line and the second bit line is maintained at approximately ground. A voltage is applied to the first recall transistor in the first trigate structure and a voltage is applied to a second recall transistor in the second tri-gate structure sufficient to turn on the first and second recall transistors. The first recall transistor coupled to the first bit line is cutoff such that the first SONOS transistor coupled to said first recall transistor thus remains erased. Conversely, the second recall transistor coupled to the second bit line is on and the second SONOS transistor coupled to the second recall transistor is therefore programmed.

In order to program the first SONOS transistor and the second SONOS transistor, they should both be erased as a first step. To perform the erase step on the first and second SONOS transistors, the first and second bit lines are held to approximately 1.8V, the word-line signal to the SRAM is held at 0V, the $V_{STR}$ signal to the first and second store transistors is held at approximately 0V and the $V_{RCL}$ signal to the first and second recall transistors is held at approximately 0V. A negative voltage that is typically −10V is applied to the signal $V_{SE}$, which gates the first and second SONOS transistors for approximately 8 ms. This process erases both the first and second SONOS transistors as it stores positively charged holes in the nitride layer of the ONO stack thus taking the threshold voltages of both the SONOS transistors to $-V_{Te}$ value.

To program the non-volatile SRAM from the data in the volatile SRAM, assuming that the last SRAM write has left a logic "1," which leaves the data true node of the SRAM cell at 1.8V and the data complement node at a logic level 0. With the word line 121 to the SRAM cell 102 at ground, and the bit line pairs BT 107 and BC 106 maintained at 1.8V, the $V_{STR}$ signal that gates the first and second store transistors is turned ON by raising VSTR to 1.8V. Next, a programming pulse and programming voltage of approximately 10V is applied on $V_{SE}$, which gates the first and second SONOS transistors. The store transistor with its gate and source voltage both at 1.8V is cutoff, while the store transistor with its gate voltage 1.8V and its source voltage at 0V is ON and puts the 0V on the source node of the SONOS transistor on the dc side of the SRAM cell. This SONOS transistor gets programmed as electrons tunnel into the nitride and get stored, thus raising the threshold voltage of the SONOS transistor on the dc side of the SRAM cell. The SONOS transistor on the dt side of the SRAM cell stays erased as its source and drain node couple up with the VSE voltage. Thus, a depletion transistor and an enhancement mode transistor are formed on both sides of the trigate.

In another embodiment, programming the first and second SONOS transistors from the bit-line pairs is provided. The volatile portion of the nvSRAM is isolated from the non-volatile portion by turning of the VSTR signal that gates the first and second store transistors in the non-volatile portion of the nvSRAM. In this embodiment, the drain node of the first recall transistor is connected to the first bit-line and the drain node of the second recall transistor is connected to the second bit line. The first and second SONOS transistors are erased using the procedure as previously described. Assuming that the first bit-line, bit line true, is held at 1.8V and the second bit line, bit line compliment is held at 0V, the first and second recall transistors are turned on by raising VRCL to 1.8V. A programming pulse and voltage are applied to the VSE node that gates the first and second SONOS transistors. The recall transistor on the side where the first bit-line is held at 1.8V is cutoff, while the recall transistor on the side where the second bit-line is held at 0V is ON. The SONOS transistor on the side of the bit-line taken to ground gets programmed as electrons tunnel into the nitride and get stored, thus raising the threshold voltage of the SONOS transistor. The SONOS transistor on the first bit-line side stays erased as the source and drain node couple up with the VSE voltage. Thus a depletion mode transistor and an enhancement mode transistor are formed on both sides of the trigate structure. Therefore, dual programming is possible—from the SRAM cell as is currently available and from the bit line as described herein.

In another embodiment, a method for programming and erasing a non-volatile SRAM cell having a volatile portion and a stacked non-volatile portion from a bit line pair is provided. The volatile portion provides an SRAM cell with a word line, a node supplying power to said SRAM cell and a bit line pair with a first bit line and a second bit line. The stacked non-volatile portion provides a first and second non-volatile memory stack each having a recall transistor, a store transistor and a plurality of SONOS transistors. A typical number of SONOS transistors in the non-volatile memory stack is eight.

In another embodiment, a method for programming and erasing a plurality of nvSRAM cells in byte format is also provided. The bit lines and VRCL, VSE and VSTR for a particular plurality of cells forming a byte of interest can be manipulated in accordance with the method, while maintaining the particular states of the remaining cells in the array. This method allows for the programming of a byte of cells instead of the entire array of nvSRAM cells at once.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION OF THE PREFERRED EMBODIMENTS

A system and method for programming and erasing a semiconductor memory is disclosed. More particularly, the present invention uses the bit lines of a volatile memory portion of semiconductor memory so as to program and erase the non-volatile portion of the semiconductor memory.

Figure 1:
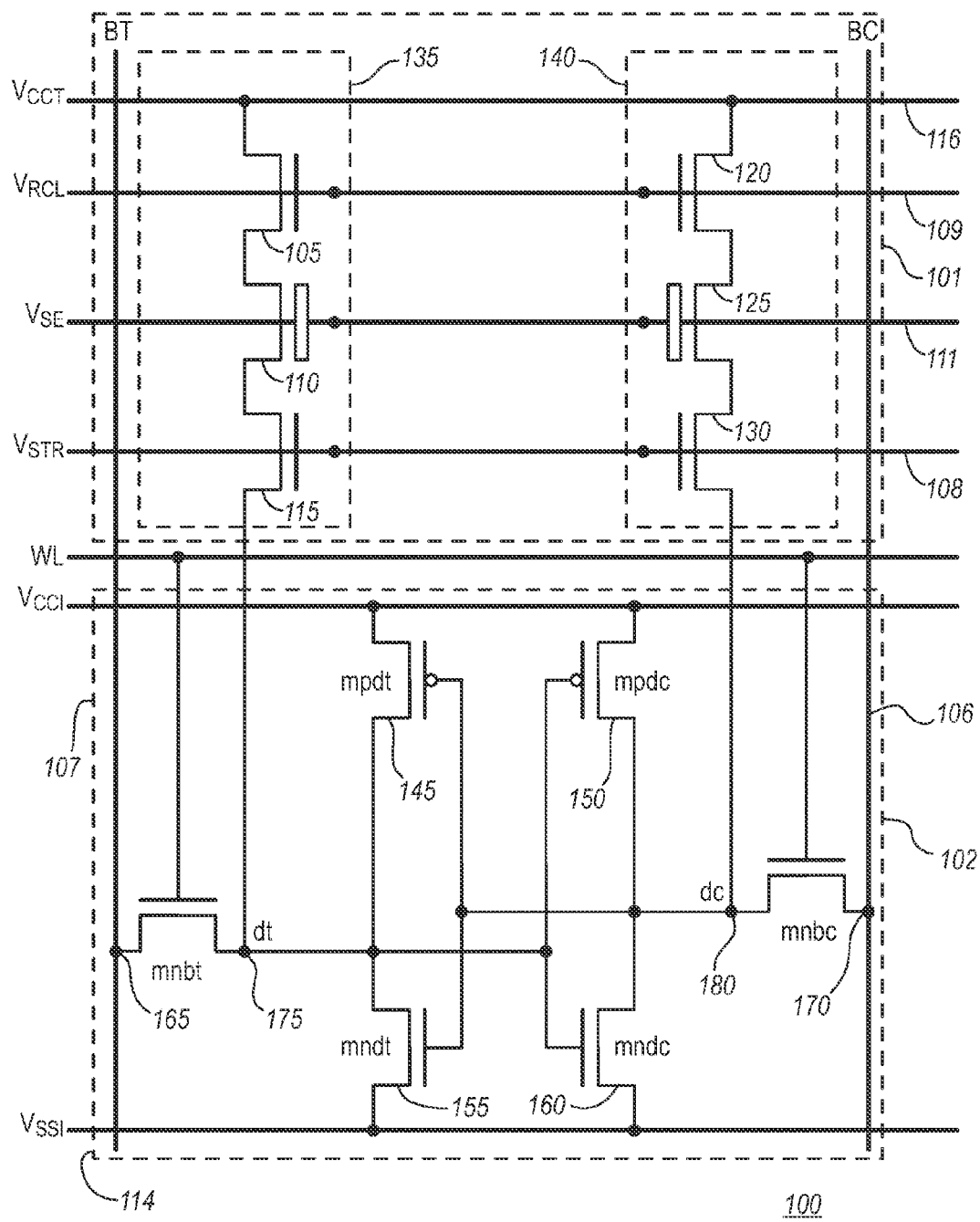
FIG. 1 is a schematic diagram illustrating an nvSRAM memory cell in accordance with one embodiment of the present invention.

FIG. 1 illustrates a typical nvSRAM cell 100 with a single SRAM and a series-connected, non-volatile memory cell, hereinafter referred to as nvSRAM device 100 in accordance with the following invention. While the nvSRAM device 100 is illustrated as having a single nvSRAM memory cell (in this case, the single SRAM and a single non-volatile memory cell), it should be appreciated that an nvSRAM device typically includes a plurality of nvSRAM cells that are integrated with a controller onto a single semiconductor chip to form an array. The array may be of any size, in one embodiment the array size is 4 Mb, which equates to an array of 2048 rows and 2048 columns for a total number of 4,194,304 nvSRAM cells in the array.

A basic nvSRAM cell 100 is comprised of a static random access memory (SRAM) cell 102 that is capable of communicating a bit of data to and from an exterior environment and a non-volatile (nv) cell 101 for providing backup storage to the SRAM cell in the event power is removed from the nvSRAM cell 100. More particularly, the SRAM cell 102 is capable, as long as power is being provided, of receiving a bit of data from an exterior environment, retaining the bit of data, and transmitting the bit of data back to the exterior environment. If, however, power is removed from the SRAM cell 102, the SRAM cell will lose the bit of data. The nv cell 101 prevents loss of the bit of data by providing the capability to receive the bit of data from the SRAM 102, retain the bit of data in the absence of power being provided to the SRAM cell 102, and return the bit of data to the SRAM cell 102 when power is restored. For example, if there is a possibility of power to the SRAM cell 102 being lost, the bit of data can be transferred from the SRAM cell 102 to the nv cell 101 in a store operation. At a later time, the bit of data can be returned from the nv cell 101 to the SRAM cell 102 in a recall operation. The SRAM cell 102 can then transmit the bit of data to the exterior environment, if desired.

Typically, the basic nvSRAM cell 100 is combined with other nvSRAM cells to form a memory array that is integrated onto a single semiconductor chip. Typical nvSRAM memory arrays are comprised of 1,048,576 nvSRAM cells. The motivation for creating integrated semiconductor chips with ever larger arrays of nvSRAM cells is that the area per cell decreases as more cells are integrated onto a chip. For example, four chips, each with arrays of 262,144 nvSRAM cells (an array of 512×512), occupy a greater surface area than a single chip with an array of 1,048,576 nvSRAM cells (an array of 1024×1024). The area occupied by a memory chip is important because many applications for the chip, such as personal computers, are continually attempting to provide more memory in less space.

In the illustrated example, the volatile portion 102 is a six transistor Static Random Access Memory (SRAM) cell. The word static indicates that the memory retains its contents as long as power remains applied. Random access means that locations in the memory can be written to or read from in any order, regardless of the memory location that was accessed last.

SRAM cell 102 typically has three states: standby, writing and reading. In the standby state, the circuit is idle waiting for a read or a write operation to occur. In stand-by mode operation, the word line WL is not asserted and so transistors 165, 170 disconnect the SRAM cell 102 from the bit lines BT 107 and BC 106. The first cross coupled inverter formed by transistors 145, 155 and the second cross coupled inverter formed by transistors 150, 160 continue to reinforce each other and the data remains unchanged.

In the read state, data within SRAM cell 102 is requested. Assume for purposes of explanation that the contents of the memory of SRAM cell 102 is a 1 stored at dt 175 and a 0 stored at dc 180. The read cycles starts by pre-charging both the bit lines to a logical 1, then asserting the word line WL, thereby enabling both transistors 165, 170. The values stored in dt 175 and dc 180 are transferred to the bit lines BT 107 and BC 106 by leaving BT at its pre-charged value and discharging BC through transistor 170 and transistor 160. On the BT side, transistor 165 is cutoff because the $V_{GS}$ on this transistor equals 0V, and thus BT remains pre-charged at logic 1. If, however, the contents of the memory of SRAM cell 102 was a logic 0, the opposite would happen and BC would be pulled towards a logic 1 and BT would discharge through transistor 165 and transistor 155.

In the write state, the contents of SRAM cell 102 is updated. The write cycle begins by applying the value to be written to the bit lines BT 107 and BC 106. Assume, for example, the dt 175 is at a logic level 1 and dc 180 is at a logic level 0. If a logic 0 is desired to be written, then bit line BT 107 is taken to ground while BC 106 is pre-charged to Vcc. Upon asserting the word line, the high node dt 175 inside the SRAM cell 102 gets discharged through transistor 165 to ground and the cell flips its state, thus writing a logic 0 into the cell.

Each bit in an SRAM is stored on four transistors that form two cross-coupled inverters. The storage cell has two stable states, which are used to denote a 0 and a 1. Two additional transistors serve to control access to a storage cell during read and write operations. Accordingly, six transistors store one memory bit.

Access to each cell is enabled by the word line (WL) 121 that controls the two transistors 165, 170. Transistors 165, 170 control whether the cell should be connected to the bit lines BT 107 and BC 106. Transistors 165, 170 are also used to transfer data for both the read and write operations. Two bit lines BT and BC are not required, however, both the true signal and the compliment of that signal provide improved noise margins.

Generally, as illustrated in FIG. 1, nvSRAM cell 100 comprises a plurality of n-channel, Field-Effect Transistors (FETs); a plurality of nonvolatile elements, such as nonvolatile transistors or capacitors; and a plurality of resistors. It should, however, be appreciated that other types of transistors, such as p-channel FETs, and combinations of different types of transistors can be utilized.

As shown in FIG. 1, transistor mpdt 145 and mndt 155 form the first inverter and transistors mndc 160 and mpdc 150 form the second inverter. The output of the first inverter dt 175 is coupled to the input of the second inverter and the output of the second inverter dc 180 is coupled to the input of the first inverter. The configuration of the first and second inverters form the latch in the SRAM cell 102. There are two pass transistors 165, 170 that are driven by the signal WL 121. The first pass transistor mnbt 165 connects the bit line BT 107 to the data true node 175 and the second pass transistor mnbc 170 connects the bit-line complement BC 106 to the data complement node dc 180.

The nonvolatile portion 101 includes a first silicon oxide nitride oxide semiconductor (SONOS) FET 110 and a second SONOS FET 125 for respectively storing the state of the SRAM cell 102. The state of SRAM cell 102 is stored in the first and second SONOS FETs 110, 125 by performing a store operation. The store of the non-volatile cell 101 is accomplished by forcing a high voltage of +10V on $V_{SE}$ signal applied to the gates of SONOS FETs 110, 125. It should be appreciated that the SONOS FETs 110, 125 can be replaced with other types of nonvolatile storage elements, such as silicon nitride oxide semiconductor (SNOS) transistors, floating gate transistors, ferroelectric transistors, and capacitors to name a few.

The nonvolatile portion 101 further includes a first store FET 115 and a second store FET 130 that operate as switches during store and recall operations to appropriately configure the nonvolatile portion 101 for the transfer of a bit of data between the volatile portion 102 and the nonvolatile portion 101. More specifically, the first and second store FETs 115, 130 function to connect the nonvolatile portion 101 to the volatile portion 102 during store and recall operations and to otherwise disconnect the nonvolatile portion 101 from the volatile portion 102. The state of the first and second store FETs 115, 130 is controlled by a $V_{STR}$ signal that is applied to the gates of the FETs. More specifically, if the $V_{STR}$ signal is LOW, the first and second store FETs 115, 130 are turned OFF to disconnect the nonvolatile portion 101 from the volatile portion 102. Conversely, if the $V_{STR}$ signal is HIGH, the first and second store FETs 115, 130 are turned ON to connect the nonvolatile portion 101 to the volatile portion 102. Typically, a LOW signal is approximately 0V and a HIGH signal is approximately 1.8V.

The nonvolatile portion 101 further includes a first recall FET 105 and a second recall FET 120 that also function as switches to place the nonvolatile portion 101 in the appropriate configuration for transferring a bit of data between the volatile portion 102 and the nonvolatile portion 101 during store and recall operations. More specifically, the first and second recall FETs 105, 120 function to connect the nonvolatile portion 101 to $V_{CCT}$ during a recall operation and to disconnect the nonvolatile portion 101 from the $V_{CCT}$ during a store operation and otherwise. The first and second recall transistors 105, 120 are turned OFF during a store operation. The state of the first and second recall FETs 105, 120 is controlled by a $V_{RCL}$ signal that is applied to the gates of the FETs. More specifically, if the $V_{RCL}$ signal is LOW, the first and second recall FETs 105, 120 are turned OFF to disconnect the nonvolatile portion 101 from $V_{CCT}$. Conversely, if the $V_{RCL}$ signal is HIGH, the first and second recall FETs 105, 120 are turned ON to connect the nonvolatile portion 101 to $V_{CCT}$. In a preferred embodiment of the present invention, the control signals on the $V_{RCL}$, $V_{SE}$, $V_{STR}$ and word lines WL are provided by a device control unit (illustrated in FIG. 2).

Figure 2:
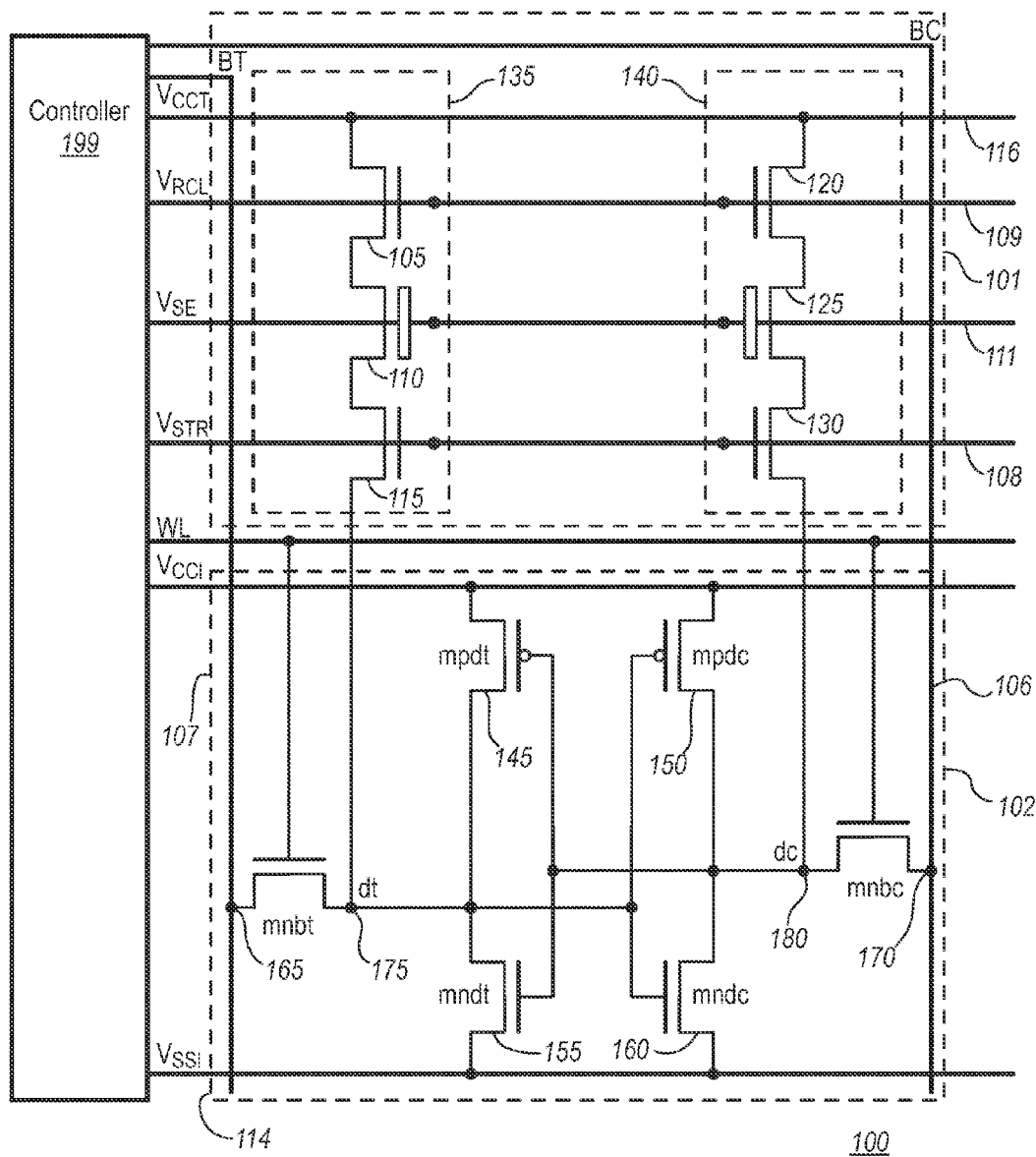
FIG. 2 is a schematic diagram illustrating an nvSRAM memory cell of FIG. 1 with an attached controller.

As illustrated in FIG. 2, a controller 199 is included in the nvSRAM device 100 for (1) providing signals to SRAM cell 102 to transfer a bit of data between the SRAM cell 102 and the exterior environment; (2) providing signals to the SRAM cell 102 and the non-volatile portion 101 to copy a bit of data from the SRAM cell 102 into the non-volatile portion 101, i.e., cause a store operation to be performed; and (3) providing signals to the SRAM cell 102 and the non-volatile portion 101 to copy a bit of data from the non-volatile portion 101 to the SRAM cell 102, i.e., cause a recall operation to be performed. The controller 199 performs the noted operations based upon signals received from a device, typically a microprocessor that is located exterior to the nvSRAM device 100. For example, if a microprocessor required the bit of data stored in the SRAM 102, it would issue a command to the controller 199. In response, the controller 199 would provide the signals to the SRAM cell 102 to cause the bit of data in the SRAM cell 102 to be transferred to the exterior environment. The microprocessor can also request a store or recall operation to be performed on the non-volatile memory cells in the non-volatile portion 101.

The controller also performs certain operations without direction from a microprocessor. For instance, the controller 199 is capable of independently sensing when power is initially being applied to the device 100 and, in response, causing a recall operation (power-up recall operation) to be performed with respect to one of the non-volatile memory cells in the non-volatile portion 101. Conversely, the controller 199 is capable of sensing when power is being removed from the device 100 and, in response, causing a store operation (power-down store operation) to be performed with respect to one of the non-volatile memory cells in the non-volatile portion 101. The non-volatile memory cell in the non-volatile portion 101 to which the bit of data in the SRAM cell 102 is transferred in the case of a power-down and the non-volatile memory cell in the non-volatile portion 101 from which a bit of data is recalled in the event of a power-up is established in the nvSRAM 100 during manufacture. Alternatively, the nvSRAM 100 is designed to allow the user to configure stores or recalls on the non-volatile memory cells. This configurability can be achieved via a command that is issued to the nvSRAM 100 or any of the other ways known in the art.

It should be appreciated that other nonvolatile configurations are possible to achieve the functions of the nonvolatile portion 101 of the cell 100 and the invention is in no way limited to the particular configuration illustrated in FIG. 1. The particular configuration utilized in any application will depend upon both technological and performance criteria.

During normal SRAM cell operation, node $V_{STR}$ is held low which disconnects the nonvolatile section 101 of the nvSRAM cell from the volatile section 102. In other words, there is typically no communication between volatile section 102 and nonvolatile section 101 of the memory cell 100. The volatile section 102 of memory cell 100 is accessed in the following manner. The word line, WL 121, is raised to approximately 1.8V to turn on the pass transistor gates 165, 170 and the data is read or written differentially through the bit lines, BT 107 and BC 106. The transfer of data from the volatile section 102 to the non-volatile section 101, i.e. a STORE operation, takes place in two steps, during which the word line, WL 121, is OFF or at 0V (i.e., ground).

During the first step, the erase portion of the STORE cycle, nonvolatile control lines $V_{STR}$ 108 and $V_{RCL}$ 109 remain low or OFF, which is typically 0V. Then, non-volatile transistor gate of SONOS transistors 110, 125 is pumped down to a negative super-voltage through node $V_{SE}$ 111 sufficient to positively charge the nitride dielectric through direct tunneling across the ultra-thin tunnel oxide. In a typical arrangement, the negative super-voltage is approximately equal to −10V. Node $V_{SE}$ 111 is held at the negative super-voltage long enough to convert all the threshold voltages, $V_T$, of all the nitride transistors in the array to equal depletion values. The erase portion of the STORE cycle is completed by discharging $V_{SE}$ back to ground.

To program the non-volatile SRAM from the data in the volatile SRAM, assuming that the last SRAM write has left a logic "1," which leaves the data true node of the SRAM cell at 1.8V and the data complement node at a logic level 0. With the word line 121 to the SRAM cell 102 at ground, and the bit line pairs BT 107 and BC 106 maintained at 1.8V, the VSTR signal that gates the first and second store transistors is turned ON by raising VSTR to 1.8V. Next, a programming pulse and programming voltage of approximately 10V is applied on VSE, which gates the first and second SONOS transistors. The store transistor with its gate and source voltage both at 1.8V is cutoff, while the store transistor with its gate voltage 1.8V and its source voltage at 0V is ON and puts the 0V on the source node of the SONOS transistor on the dc side of the SRAM cell. This SONOS transistor gets programmed as electrons tunnel into the nitride and get stored, thus raising the threshold voltage of the SONOS transistor on the dc side of the SRAM cell. The SONOS transistor on the dt side of the SRAM cell stays erased as its source and drain node couple up with the VSE voltage. Thus, a depletion transistor and an enhancement mode transistor are formed on both sides of the trigate.

The RECALL cycle begins by clearing the existing SRAM data, first by discharging the bit lines, BT 107 and BC 106, clamping $V_{CCI}$ to $V_{SSI}$ and then by turning on the word line, WL 121. With word line 121 ON and the bit lines BT 107 and BC 106 at ground, the data nodes dt 175 and dc 180 are discharged to ground. The word line 121 is then returned to ground. Both nodes $V_{STR}$ and $V_{RCL}$ are turned on, providing a charging path to the internal nodes of the volatile section 102 through the nonvolatile section 101 to the power supply. With nonvolatile gate, $V_{SE}$, held at ground and assuming the last STORE operation left SONOS transistor 110 erased and SONOS transistor 125 programmed, and assuming that the erase threshold is −1V and the program threshold is +1V, the SONOS transistor 110 will conduct current while the SONOS transistor 125 will not because its gate voltage is below its VT. Node dt 175 charges up high, while node dc 180 remains low, thereby reestablishing the data corresponding to the last STORE cycle as explained above. The RECALL operation is completed by powering up the SRAM and returning all control lines to their default states.

Figure 3:
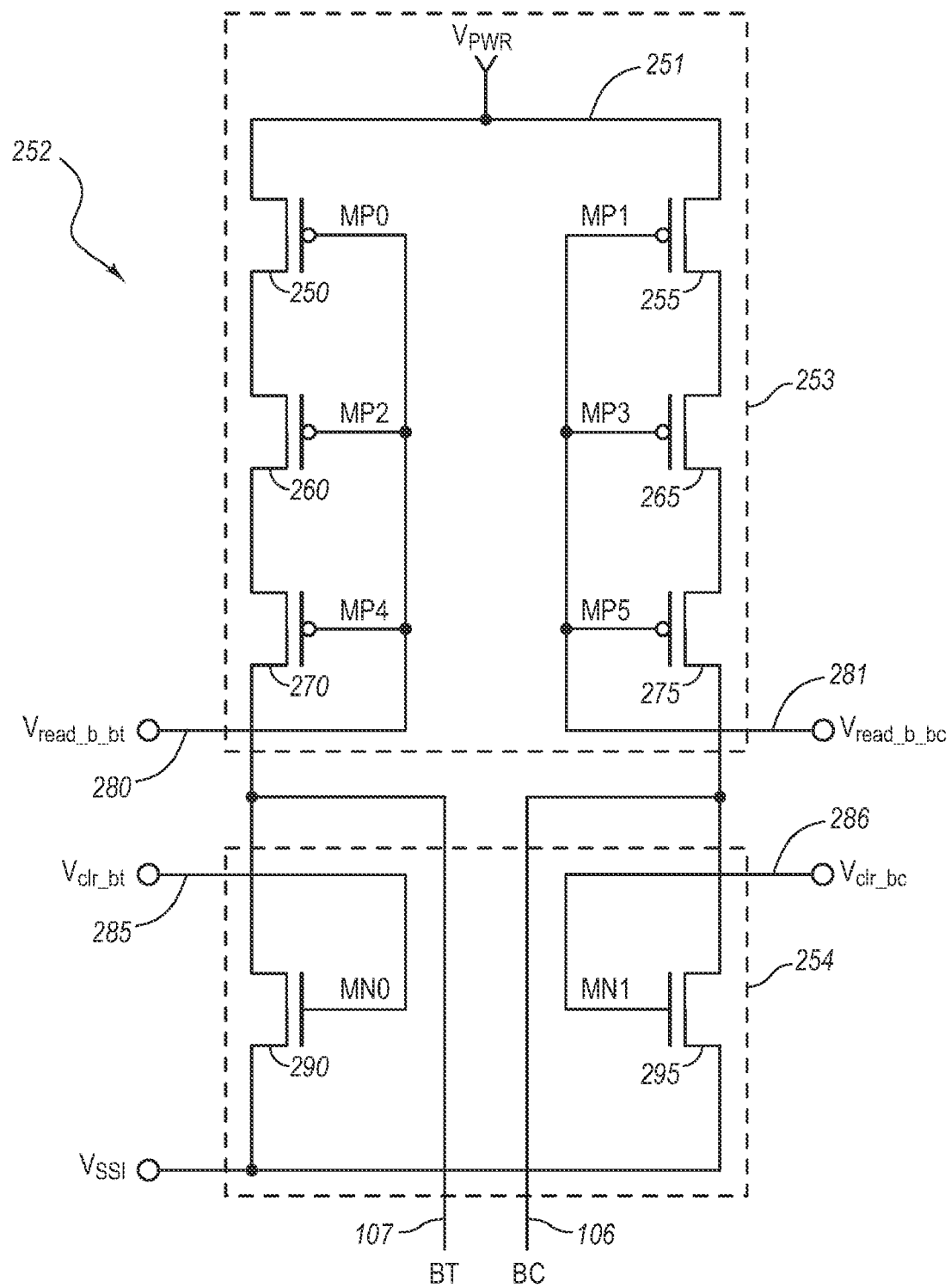
FIG. 3 is a schematic diagram illustrating a array reset cell of FIG. 1.

In accordance with the present invention, FIG. 3 illustrates an array reset circuit 252 for controlling each bit line in a bit line pair. Array reset circuit 252 is capable of independently operating bit lines BT 107 and BC 106. In other words, array reset circuit 252 may independently drive the state of bit line BT 107 either HIGH or LOW—which in the present invention is 1.8V or 0.0V respectively—without regards for the state of bit line BC 106. At the same time, bit line BC 106 may be driven HIGH or LOW, and the state of bit line BT 107 has no effect.

Array reset circuit 252 is comprised of a first circuit portion 253 and a second circuit portion 254. First circuit portion 253 has a first plurality of series connected p-channel transistors 250, 260, 270 and a second plurality of series connected p-channel transistors 255, 265, 275 that act as a load for the bit lines BT 107 and BC 106 respectively. The sources of transistor 250 and transistor 255 are connected to a power source $V_{PWR}$ 251. The drains of transistors 270 and transistor 275 are connected to the BT 107 and BC 106 respectively and keep the bit-lines pre-charged to VPWR 251. The gates of transistors 250, 260, 270 are connected together and coupled to node $V_{read\_b\_bt}$. The gates of transistors 255, 265, 275 are connected together and coupled to node $V_{read\_b\_bc}$. Second circuit portion 254 has a first n-channel transistor 290 and a second n-channel transistor 295 that couple the bit lines BT 107 and BC 106 to ground node $V_{SSI}$. The gate of transistor 290 is coupled to $V_{clr\_bt}$, the source is connected to ground node $V_{SSI}$ and the drain is coupled to BT 107. The gate of transistor 295 is coupled to $V_{clr\_bc}$, the source is connected to ground node $V_{SSI}$ and the drain is coupled to BC 106.

Figure 8:
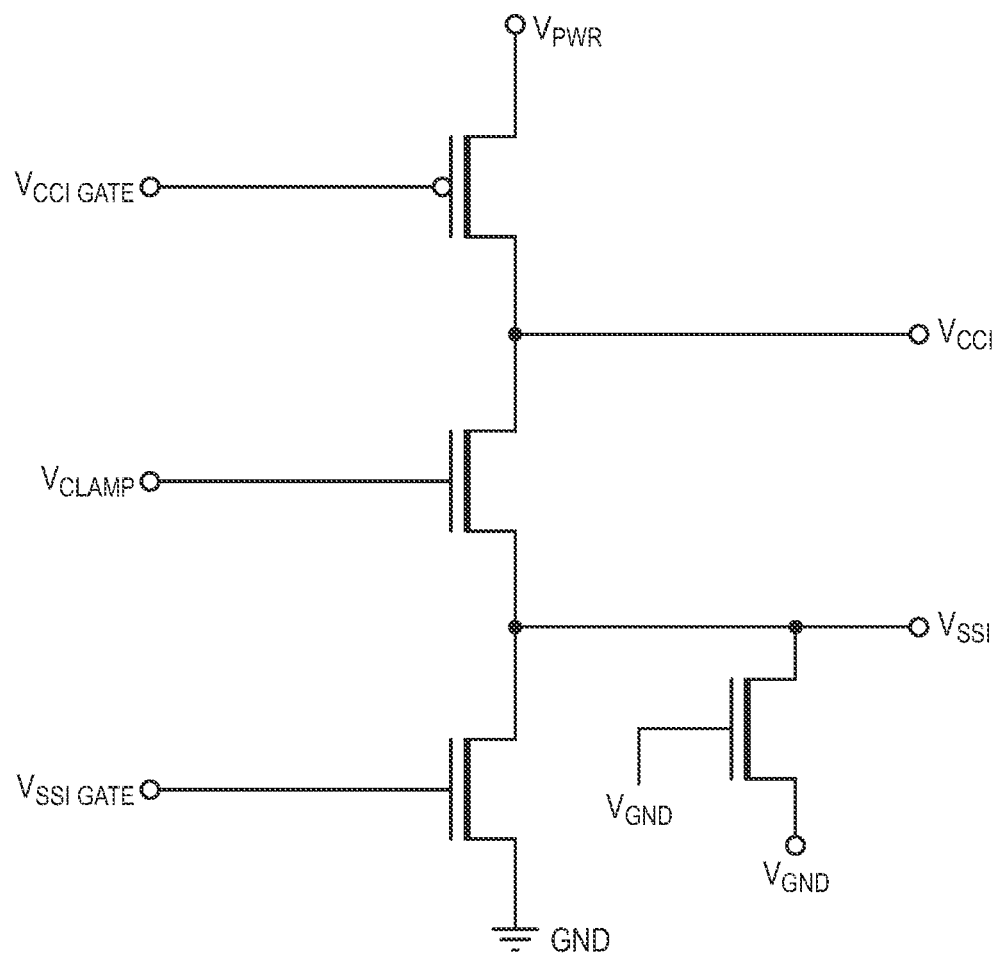
FIG. 8 illustrates the clamp transistor that operates to clamp $V_{CCI}$ to $V_{SSI}$.

In an operation for grounding and energizing the bit lines, $V_{CCI}$ and $V_{SSI}$ in memory cell 100 are clamped close to chip ground $V_{SS}$, as shown in FIG. 8. During normal SRAM operation, $V_{read\_b\_bt}$ and $V_{read\_b\_bc}$ are held at ground (0V) and $V_{clr\_bt}$ and $V_{clr\_bc}$ are held at 0V, thus enabling the bit-lines to be pre-charged to VPWR 251. A single bit line, for purposes of illustration bit line BC 106, may be driven LOW or to chip ground. Accordingly, $V_{read\_b\_bc}$ 281 and $V_{clr\_bc}$ 286 are maintained HIGH and $V_{read\_b\_bt}$ 280 and $V_{clr\_bt}$ 285 are maintained LOW. Driving $V_{read\_b\_bc}$ 281 and $V_{clr\_bc}$ 286 HIGH turns OFF the series connected p-channel transistors 255, 265, 275 and turns the n-channel transistor 295 to an ON state. Accordingly, bit line BC 106 is connected to ground node $V_{SSI}$ and thus driven LOW to chip ground. Driving $V_{read\_b\_bt}$ 280 and $V_{clr\_bt}$ 285 LOW turns ON the series connected p-channel transistors 250, 260, 270 and turns the n-channel transistor 290 OFF. The series connected p-channel transistors become a load for bit Line BT 107 and thus energize BT 107 to a HIGH state.

Figure 4:
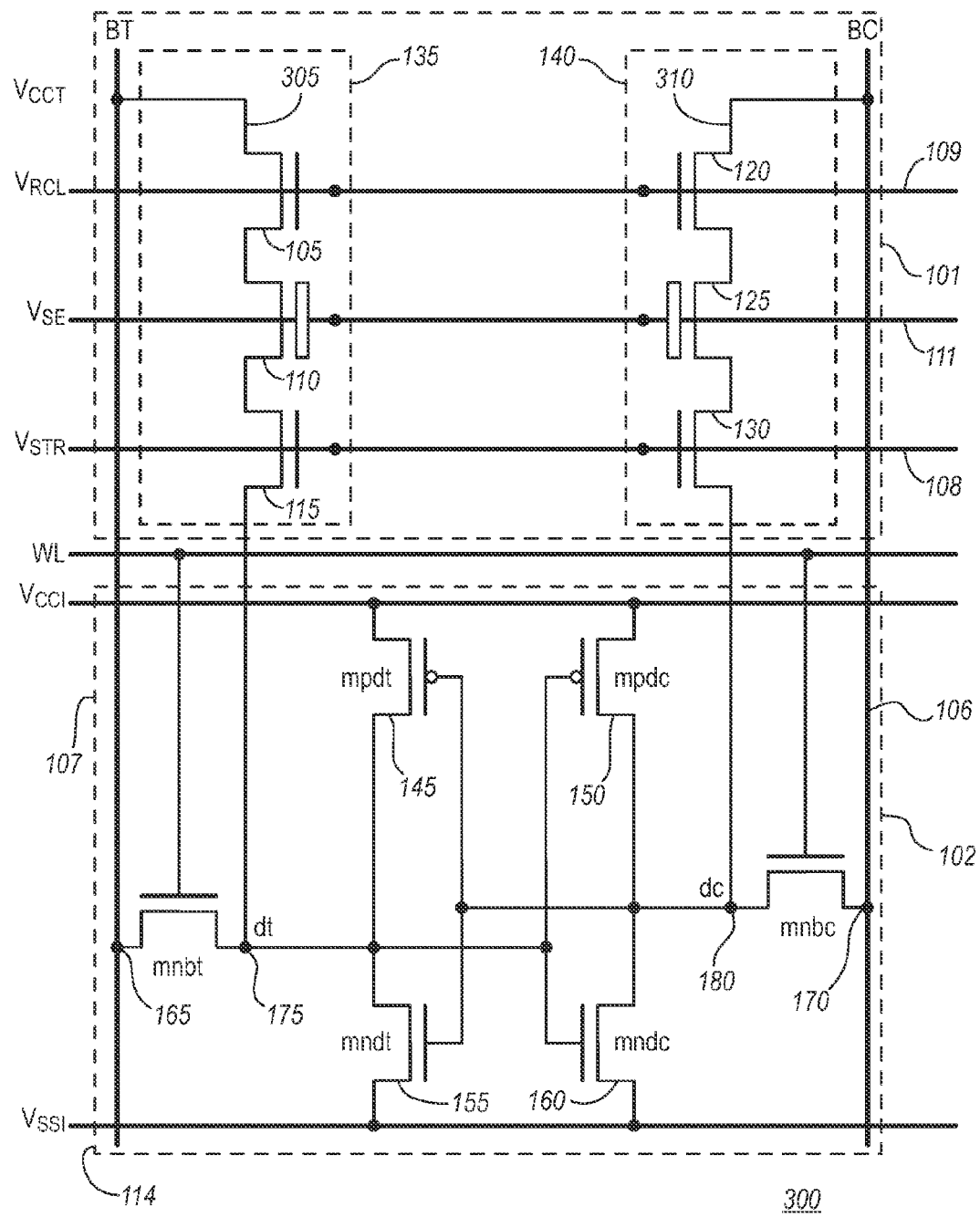
FIG. 4 is a schematic diagram illustrating a modified nvSRAM memory cell of FIG. 1 in accordance with the present invention.

FIG. 4 illustrates an alternate configuration for basic nvS-RAM cell 100 illustrated and described with respect to FIG. 1. Non-volatile SRAM cell 300 is configured in much the same way as cell 100, with the exception of tying the drain 305 of recall transistor 105 to bit line BT 107 and the drain 310 of recall transistor 120 to bit line BC 106. In this way, the bit line pair of BT 107 and BC 106 can supply power to the drains 305, 310 of recall transistors 105, 120 respectively as well as pull the drains of the recall transistors to ground. In addition, since array reset circuit 252 is coupled to the bit lines BT 107 and BC 106, either of the bit lines may be independently driven HIGH and LOW without regards to the state of the other bit line, thus allowing the transistor tri-gates 135, 140 to be independently controlled from the bit lines instead of the voltage source $V_{CCT}$ 116 shown in FIG. 1. In an alternate embodiment not shown, $V_{CCT}$ 116 may also be included and coupled to non-volatile SRAM cell 300 so as to provide a dual-programming technique—i.e., from either the bit lines as described, or from the volatile portion of the SRAM cell 102 as described above.

Figure 5:
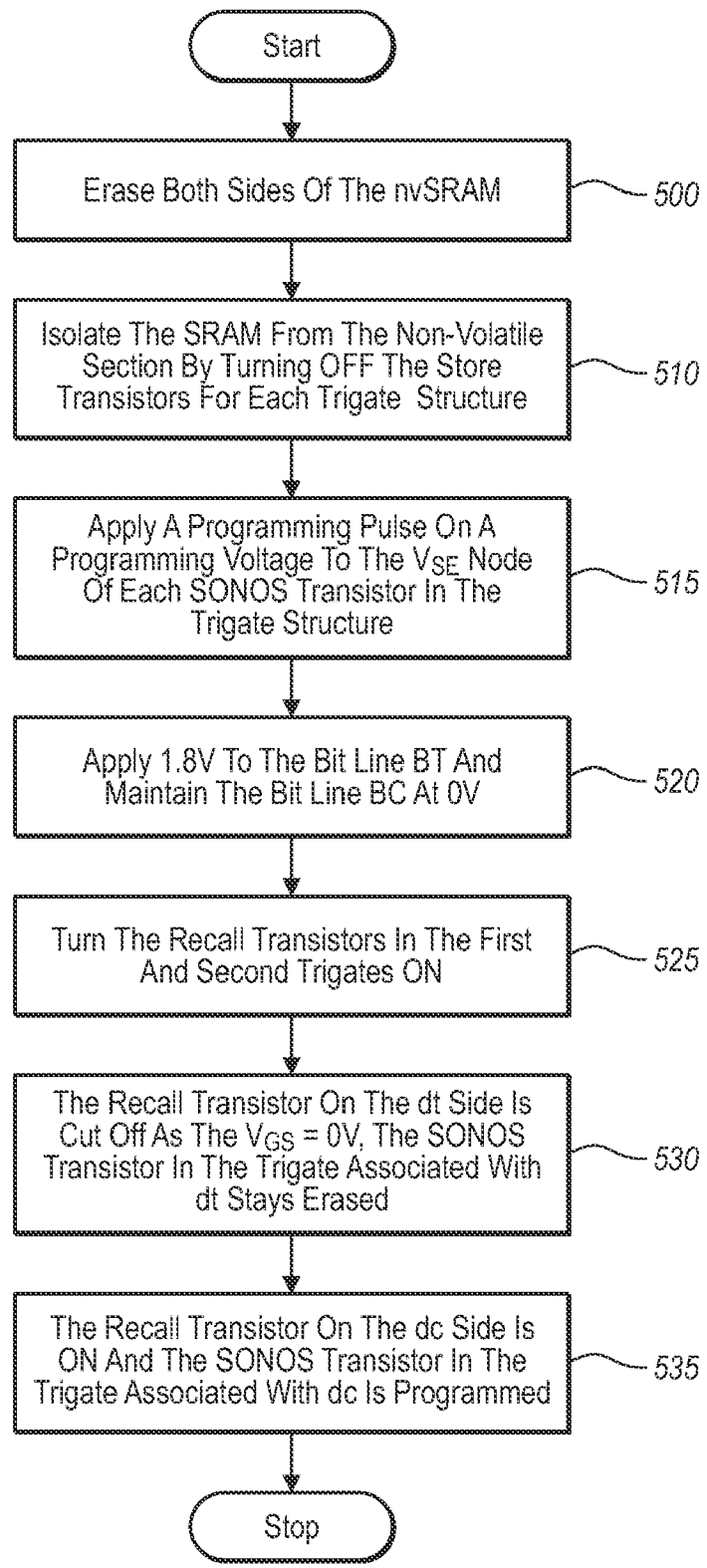
FIG. 5 is a flow chart illustrating a typical procedure for programming the SONOS transistors in tri-gate structures from the bit lines.

In accordance with the present invention, FIG. 5 illustrates a procedure for erasing the SONOS transistors 110, 125 in tri-gate structures 135, 140. In step 540, the bit lines BT and BC are energized to a HIGH condition, for example 1.8V. The recall transistors 105, 120 and the store transistors 115, 130 in the first and second trigate structures 135, 140 in step 545 are maintained in an OFF condition. Typically, to turn OFF the store and recall transistors, $V_{RCL}$ and $V_{STR}$ are driven to approximately ground or 0V. In step 550, the pass transistors mnbt 165 and mnbc 170 are turned OFF so as to negate the effect of driving the bit lines BT 107 and BC 106 to a HIGH condition. A negative erase pulse is applied in step 555 to the VSE node for the SONOS transistors 110, 125 in the first and second trigate structures 135, 140. As illustrated in step 560, the SONOS transistors 110, 125 in the first and second trigates 135, 140 are erased.

Figure 6:
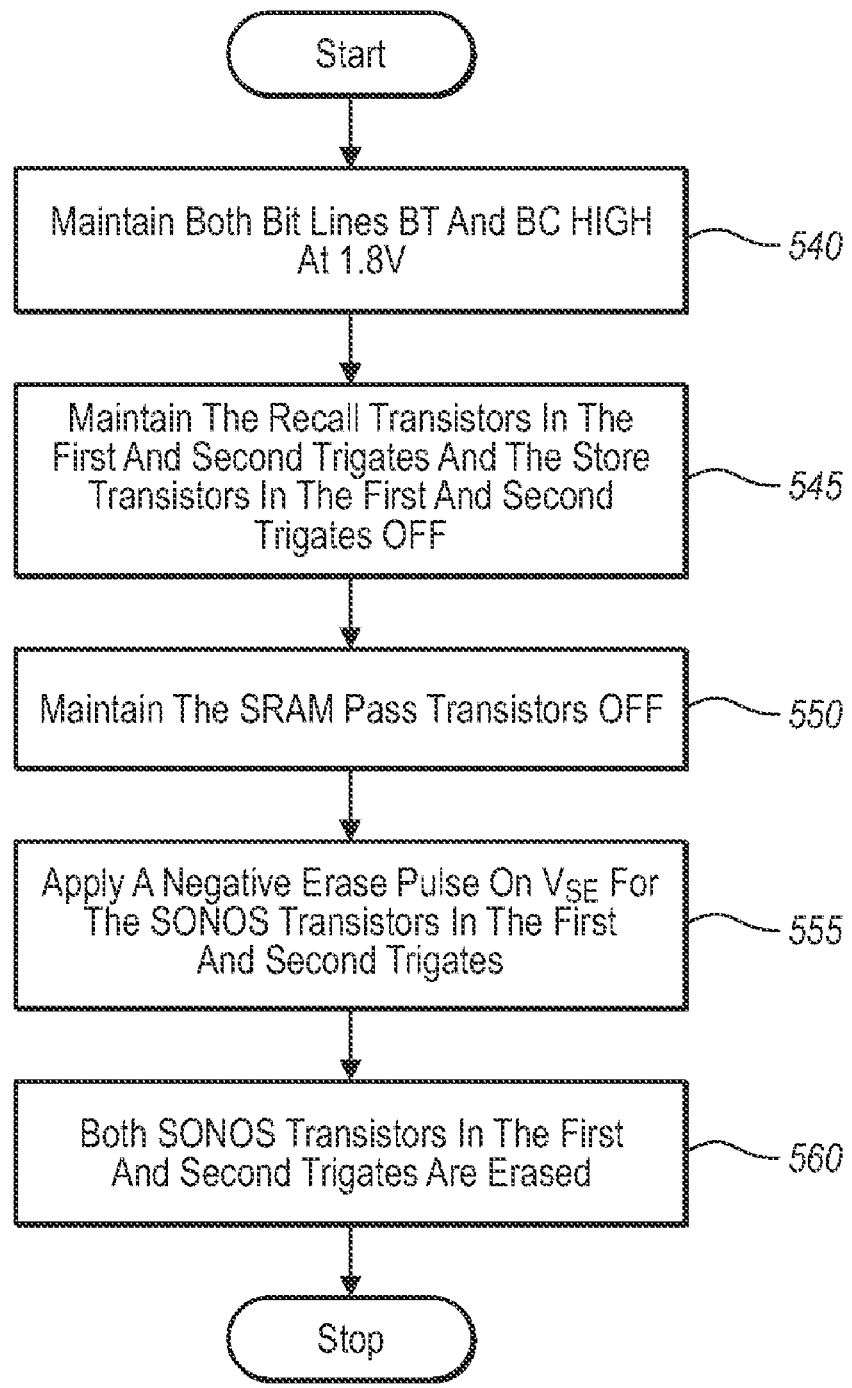
FIG. 6 illustrates a procedure for erasing the SONOS transistors in tri-gate structures from the bit lines.

FIG. 6 illustrates, via flow chart, a typical procedure for programming the SONOS transistors 110, 125 in tri-gate structures 135, 140. The method illustrated in FIG. 5 will also be described with reference to the schematic shown in FIG. 4. As shown in step 500, the non-volatile section 101 of the nvSRAM 300 is erased. More particularly, the SONOS transistors 110, 125 in the first and second trigate 135, 140 are erased in a manner consistent with the description above. In step 510, the volatile portion of the nvSRAM—the SRAM 102—is isolated from the non-volatile portion 101 by turning OFF the store transistors 115, 130 for the first and second trigate structures 135, 140 respectively. For example, in the illustrated embodiment, store transistors 115, 130 may be turned OFF by coupling $V_{STR}$ to ground. Continuing with step 515, controller 199 applies a programming pulse and programming voltage to the $V_{SE}$ node of the SONOS transistors 110, 125 in the trigate structures 135, 140 respectively.

A voltage of approximately 1.8V or a HIGH condition is applied in step 520 to the bit line BT 107 and bit line BC is held at approximately ground or a LOW condition using the data in buffers, BT 107 is held high 1.8V and the bit-line complement BC 106 is held at 0V. Continuing with step 525, the recall transistors 105, 120 in the first and second trigate structures 135, 140 are turned ON, typically by applying a voltage of approximately 1.8V to $V_{RCL}$ which in turn applies the voltage to the gate node of recall transistors 105, 120.

As illustrated in step 530, because the bit line BT 107 is energized to approximately 1.8V and the voltage on the gate of the recall transistor 105 is also maintained at approximately the value of $V_{RCL}$ of 1.8V, the voltage $V_{GS}$ is 0V and the recall transistor 105 is cutoff. The SONOS transistor 110 in the first trigate structure 135 associated with the BT node remains erased. Continuing with step 530, because the bit line BC 107 is maintained at approximately 0V or ground, the recall transistor 120 is ON. The SONOS transistor 125 in the second trigate structure 140 associated with the BC node is programmed.

Figure 7:
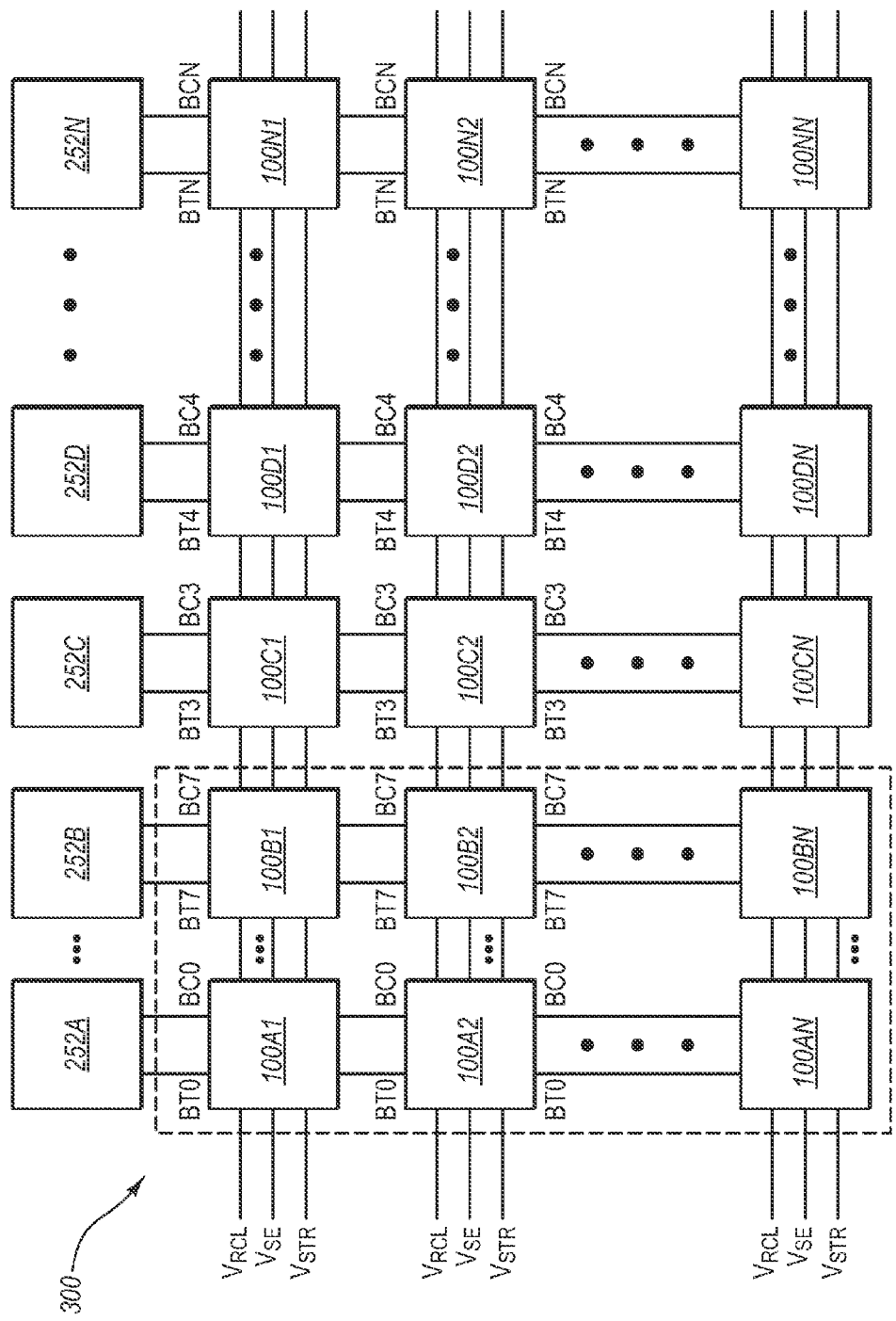
FIG. 7 is a block diagram of an array of memory cells having a number of rows and columns including an array reset circuit coupled to the bit line pairs of memory cells in each column.

FIG. 7 illustrates an array of non-volatile SRAM cells coupled to a plurality of array reset circuits. For example the bit lines BT1 and BC1 are common to the nvSRAM cells 100A1-100AN in a column, where 'N' is the number of nvSRAM cells in a column. For purposes of illustration and understanding, for a 1 MB array, the value of N=1024. Similarly, $V_{RCL}$, $V_{SE}$ and $V_{STR}$ are common to nvSRAM cells 100A1-100N1 in a row, where 'N' is the number of nvSRAM cells in the row. For the same 1 MB array described above, N=1024, thus providing for 1,048,576 nvSRAM cells in the array.

Since $V_{RCL}$, $V_{SE}$ and $V_{STR}$ are common to all nvSRAM cells in each row and bit lines are common to the nvSRAM cells in a column, the present invention illustrated and described with respect to FIGS. 4 and 5 may be utilized to program a group of nvSRAM cells forming a byte. For example, if it was desired to isolate and program a group of nvSRAM cells 300 making up a byte, the bit lines BC0-BC7 and BT0-BT7 for the cells are driven to ground and the $V_{RCL}$, $V_{SE}$ and $V_{STR}$ used to control the trigate transistors in the byte grouping 300 are energized in accordance with the steps of the method described above in FIG. 5, while maintaining the levels of the remaining bit lines at a level of $V_{CC}$ such that only the cells making up the byte 300 are programmed and the remaining nvSRAM cells remain unaddressed or erased.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

We claim:

1. A method for programming a first and second tri-gate structure in a non-volatile SRAM cell from a bit line pair, said non-volatile SRAM having a volatile portion and a non-volatile portion, each tri-gate structure in said non-volatile portion having a recall transistor, a store transistor and a SONOS transistor, said volatile portion having an SRAM cell having a word line, a node supplying power to said SRAM cell and a bit line pair with a first bit line and a second bit line, said method comprising:

coupling a drain of a first recall transistor in said first tri-gate structure to said first bit line of said bit line pair;

coupling a drain of a second recall transistor in said second tri-gate to said second bit line of said bit line pair;

erasing a first SONOS transistor in said first tri-gate structure and a second SONOS transistor in said second tri-gate structure, said first and second SONOS transistors associated with said non-volatile portion of said SRAM cell;

isolating said volatile portion from said non-volatile portion by turning off a first store transistor in said first tri-gate structure and turning off a second store transistor in said second tri-gate structure;

applying a programming pulse and a programming voltage to said first and second SONOS transistors in said first and second tri-gate structures so as to program at least one of said first and second tri-gate structures in said non-volatile portion;

maintaining said first bit line at a voltage corresponding to a high condition for said first bit line and maintaining said second bit line at approximately ground; and applying a voltage to a first recall transistor in said first trigate structure and applying voltage to a second recall transistor in said second tri-gate structure sufficient to turn on said first and second recall transistors, wherein said first recall transistor coupled to said first bit line is cutoff such that said first SONOS transistor coupled to said first recall transistor remain erased and wherein said second recall transistor coupled to said second bit line is on and said second SONOS transistor coupled to said second recall transistor is programmed.

2. A method for programming a non-volatile SRAM cell from a bit line pair, said non-volatile SRAM having a volatile portion and a stacked non-volatile portion, said volatile portion having an SRAM cell having a word line, a node supplying power to said SRAM cell and a bit line pair with a first bit line and a second bit line, said stacked non-volatile portion having a first and second non-volatile memory stack each having a recall transistor, a store transistor and a plurality of SONOS transistors, said method comprising:

coupling a drain of a first recall transistor in said first non-volatile memory stack to said first bit line of said bit line pair;

coupling a drain of a second recall transistor in said second non-volatile memory stack to said second bit line of said bit line pair;

erasing a first plurality of SONOS transistors in said first non-volatile memory stack and a second plurality of SONOS transistors in said second non-volatile memory stack;

isolating said volatile portion from said non-volatile portion by turning off a first store transistor in said first non-volatile memory stack and turning off a second store transistor in said second non-volatile memory stack;

applying a programming pulse and a programming voltage to said first and second plurality of SONOS transistors in said first and second non-volatile memory stacks so as to program at least one of said first and second non-volatile memory stacks;

maintaining said first bit line at a voltage corresponding to a high condition for said first bit line and maintaining said second bit line at approximately ground; and applying a voltage to a first recall transistor in said first non-volatile memory stack and applying voltage to a second recall transistor in said second non-volatile memory stack sufficient to turn on said first and second recall transistors, wherein said first recall transistor coupled to said first bit line is cutoff such that said first plurality of SONOS transistors coupled to said first recall transistor remain erased and wherein said second recall transistor coupled to said second bit line is on and said second plurality of SONOS transistors coupled to said second recall transistor are programmed.

* * * * *